(12) United States Patent
Stroemberg et al.

(10) Patent No.: US 11,349,274 B2
(45) Date of Patent: May 31, 2022

(54) AMPLIFIER ASSEMBLY

(71) Applicant: Lumentum Operations LLC, Milpitas, CA (US)

(72) Inventors: Christoffer Stroemberg, Zurich (CH); Susan Fung, Milpitas, CA (US); Derek A. Tucker, Milpitas, CA (US)

(73) Assignee: Lumentum Operations LLC, San Jose, CA (US)

( * ) Notice: Subject to any disclaimer, the term of this patent is extended or adjusted under 35 U.S.C. 154(b) by 63 days.

(21) Appl. No.: 16/588,708

(22) Filed: Sep. 30, 2019

(65) Prior Publication Data

US 2020/0119510 A1 Apr. 16, 2020

Related U.S. Application Data

(60) Provisional application No. 62/746,337, filed on Oct. 16, 2018.

(51) Int. Cl.
| | |
|---|---|
| *H01S 3/04* | (2006.01) |
| *H05K 5/06* | (2006.01) |
| *H01S 3/16* | (2006.01) |
| *H01S 3/06* | (2006.01) |
| *H01S 3/067* | (2006.01) |
| *H01S 5/02* | (2006.01) |
| *H01S 3/02* | (2006.01) |
| *H01S 5/50* | (2006.01) |

(52) U.S. Cl.
CPC .......... *H01S 3/0405* (2013.01); *H01S 3/025* (2013.01); *H01S 3/061* (2013.01); *H01S 3/0615* (2013.01); *H01S 3/0623* (2013.01); *H01S 3/06754* (2013.01); *H01S 3/1643* (2013.01); *H01S 5/0216* (2013.01); *H01S 5/50* (2013.01); *H05K 5/06* (2013.01)

(58) Field of Classification Search
CPC ...... H01S 3/0405; H01S 3/0615; H01S 3/025; H01S 5/0216; H01S 3/0623; H01S 3/061
See application file for complete search history.

(56) References Cited

U.S. PATENT DOCUMENTS

| | | | |
|---|---|---|---|
| 4,505,419 A | * | 3/1985 | Steeb ................... B23K 1/0014 228/183 |
| 4,553,238 A | | 11/1985 | Shaw et al. |

(Continued)

FOREIGN PATENT DOCUMENTS

| | | |
|---|---|---|
| EP | 1966856 A2 | 9/2008 |
| JP | 2008021879 A | 1/2008 |

(Continued)

OTHER PUBLICATIONS

English translation of WO2015/117727A1 (Year: 2015).*

*Primary Examiner* — Yuanda Zhang
(74) *Attorney, Agent, or Firm* — Harrity & Harrity, LLP

(57) ABSTRACT

An amplifier assembly may include a first heat sink plate that includes a first channel, a second heat sink plate that includes a second channel, and an amplifier rod disposed in the first channel and the second channel. The second heat sink plate may be connected with the first heat sink plate such that the first channel and the second channel align. The amplifier rod may be connected to the first heat sink plate and the second heat sink plate by a non-eutectic solder.

20 Claims, 4 Drawing Sheets

(56) References Cited

U.S. PATENT DOCUMENTS

| | | | |
|---|---|---|---|
| 4,637,028 A * | 1/1987 | Kahan | H01S 3/042 |
| | | | 372/34 |
| 4,731,795 A | 3/1988 | Clark et al. | |
| 4,949,346 A | 8/1990 | Kuper et al. | |
| 5,774,488 A * | 6/1998 | Kmetec | H01S 3/042 |
| 5,936,984 A | 8/1999 | Meissner et al. | |
| 8,625,192 B2 | 1/2014 | Balembois et al. | |
| 8,929,413 B2 | 1/2015 | Aubry et al. | |
| 2004/0013151 A1 | 1/2004 | Sumida et al. | |
| 2013/0050228 A1 * | 2/2013 | Petersen | B81C 1/0023 |
| | | | 345/501 |
| 2013/0336347 A1 | 12/2013 | Aubry et al. | |
| 2019/0341735 A1 * | 11/2019 | Apitz | H01S 3/0606 |

FOREIGN PATENT DOCUMENTS

| | | | | |
|---|---|---|---|---|
| KR | 19980070480 A | 10/1998 | | |
| WO | WO-2015117727 A1 * | 8/2015 | | H01S 3/042 |

\* cited by examiner

AMPLIFIER ASSEMBLY

RELATED APPLICATION

This application claims priority to U.S. Provisional Patent Application No. 62/746,337, filed on Oct. 16, 2018, entitled "AMPLIFIER COOLING SYSTEM," the content of which is incorporated by reference herein in its entirety.

TECHNICAL FIELD

The present disclosure relates to an amplifier assembly. More particularly, some aspects of the present disclosure relate to improving heat transfer from an amplifier rod of an amplifier assembly and/or improving a manufacturing process for an amplifier assembly.

BACKGROUND

An amplifier rod, such as an ytterbium-doped yttrium aluminum garnet (Yb:YAG) amplifier rod, may be used with a femtosecond laser to amplify an optical signal. The amplifier rod may be associated with a heat sink component that passively removes heat from the amplifier rod in order to protect an integrity of the amplifier rod.

DETAILED DESCRIPTION

Figure 1:
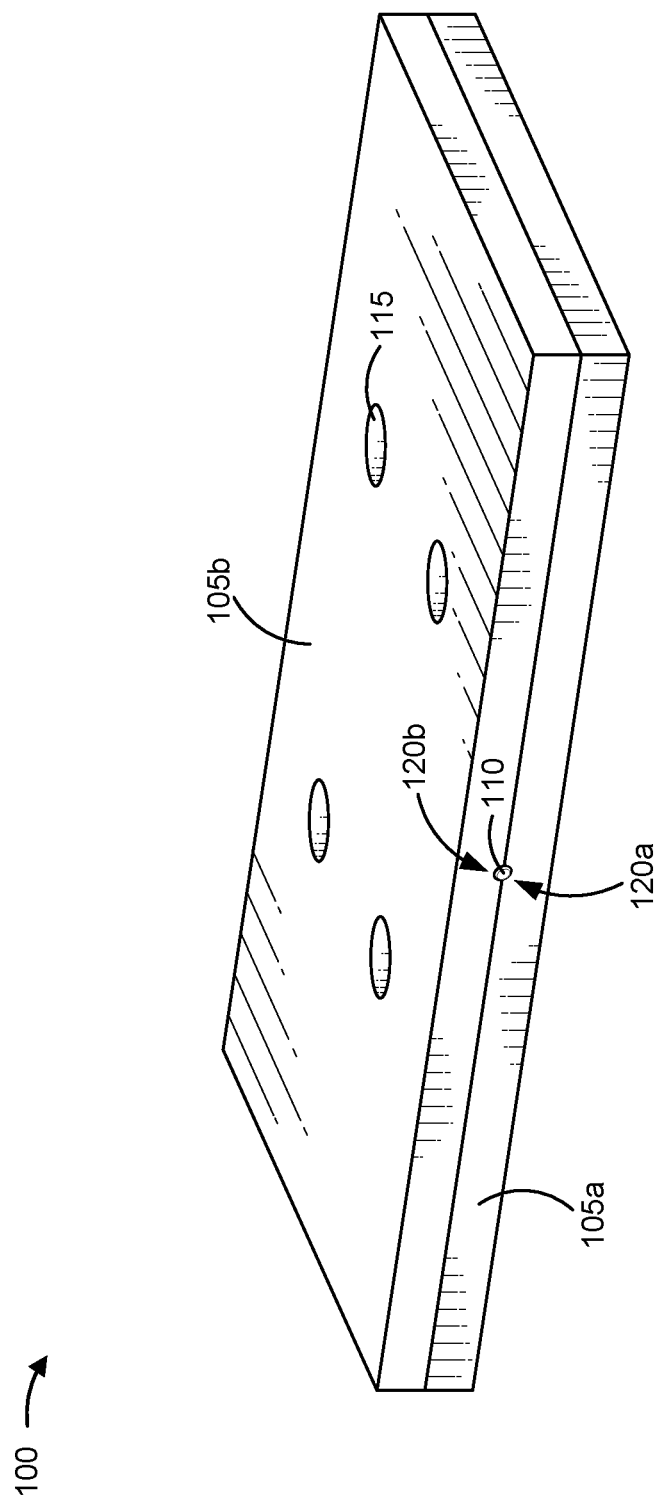
FIG. 1 is a diagram of an example amplifier assembly described herein.

The following detailed description of example implementations refers to the accompanying drawings. The same reference numbers in different drawings may identify the same or similar elements.

As described above, an amplifier rod, such as a Yb:YAG amplifier rod, may be associated with a heat sink component that passively removes heat from the amplifier rod. In some current amplifier assemblies, the amplifier rod may be soldered to a heat sink plate. For example, the heat sink plate may be a metal (e.g., copper) plate that includes a channel in which the amplifier rod is disposed. The amplifier rod may be thermally connected to the heat sink plate by solder (e.g., eutectic solder) that is included in the channel with the amplifier rod. In some cases, an enhancing chemical, such as flux, may be used with the solder to improve wetting of the amplifier rod and to maintain molten solder in the channel during a soldering process. In some cases, the soldering process may result in solder overflowing the channel and depositing on end portions of the amplifier rod. Accordingly, end portions of the amplifier rod may be ground (e.g., flush to the edge of the heat sink plate) to remove deposited solder, and the ground end portions of the amplifier rod may be polished and coated with an anti-reflection (AR) coating.

In some current amplifier assemblies, as described above, use of enhancing chemicals, such as flux, results in outgassing that exceeds acceptable levels. In addition, use of a eutectic solder, which becomes liquid during the soldering process, produces voids in the solder, thereby resulting in portions of the of the amplifier rod lacking thermal connectivity to the heat sink plate. This, in combination with the non-symmetrical design of some current amplifier assemblies, may reduce a heat transfer efficiency, reduce a longevity, and/or reduce a performance of the heat sink plate.

Moreover, grinding, polishing, and coating of the amplifier rod after the amplifier rod is soldered to the heat sink plate is technically difficult and produces inconsistent results, thereby affecting performance and usability of the amplifier rod. In some cases, the AR coating, when applied to an end portion of the amplifier rod that has a sharp edge (such as may result from grinding), may chip and/or delaminate and impair the amplifier rod's performance.

Some implementations described herein provide an amplifier assembly with improved heat exchange properties that can be manufactured with improved uniformity. For example, the amplifier assembly may include a pair of heat sink plates, each including a channel, that sandwich an amplifier rod disposed in the channels. In some implementations, the amplifier rod may be connected to the pair of heat sink plates by a non-eutectic solder without the use of an enhancing chemical that may produce excessive outgassing. Furthermore, the non-eutectic solder does not become liquid during the soldering process, thereby reducing voids between the amplifier rod and the solder, and improving thermal connectivity between the amplifier rod and the pair of heat sink plates. In addition, the use of non-eutectic solder reduces or eliminates overflow of the solder onto end portions of the amplifier rod during the soldering process, such that post-soldering grinding, polishing, and AR coating of the amplifier rod may be eliminated. Accordingly, end portions of the amplifier rod may be polished and coated with an AR coating prior to soldering the amplifier rod to the pair of heat sink plates, thereby improving manufacturing efficiency and improving performance of the AR coating. Additionally, without grinding, end portions of the amplifier rod may extend beyond an edge defined by the pair of heat sink plates, thereby further improving manufacturing efficiency and facilitating easier cleaning of the AR coating.

FIG. 1 is a diagram of an example amplifier assembly 100 described herein. As shown in FIG. 1, the amplifier assembly 100 may include a first heat sink plate 105a and a second heat sink plate 105b that sandwich an amplifier rod 110. In some implementations, each of the heat sink plates 105 may include one or more apertures 115 (e.g., four apertures 115 are shown by way of the example in FIG. 1). The apertures 115 may facilitate connection of the amplifier assembly 100 to a heat exchange system (as described in more detail below in connection with FIG. 3) and/or facilitate manufacture of the amplifier assembly 100 (as described in more detail below in connection with FIG. 4).

The heat sink plates 105 may correspond (e.g., have a difference of ±1%, ±5%, and/or the like) in size and shape. For example, the heat sink plates 105 may have corresponding dimensions (e.g., lengths, widths, and/or heights), such that the heat sink plates 105 define a common edge (e.g., a common edge of the amplifier assembly 100). As another example, the apertures 115 may have corresponding dimensions (e.g., radii), such that the apertures 115 of the first heat sink plate 105a align with the apertures 115 of the second heat sink plate 105b.

In some implementations, the heat sink plates 105 may be composed of one or more metals. For example, the heat sink plates 105 may be composed of copper. In addition, one or more faces of a heat sink plate 105 may include a metal plating (e.g., a metal plating of a different metal). For example, the metal plating may be a gold plating.

The first heat sink plate 105a may include a channel 120a and the second heat sink plate 105b may include a channel 120b. The channels 120 may align and define a tunnel within which the amplifier rod 110 is disposed. A size and a shape (e.g., cylinder) of the amplifier rod 110 may correspond to those of the tunnel. For example, a radius of the amplifier rod 110 may correspond (e.g., have a difference of less than 0.1 millimeters (mm), less than 0.05 mm, less than 0.01 mm, and/or the like) to a radius of the first channel 120a or the second channel 120b. In some implementations, a shape of the amplifier rod 110 may conform to a shape of a channel 120. For example, the amplifier rod 110 may have a circular cross section that conforms to a semi-circular cross section of a channel 120. In other words, the amplifier rod 110 may be cylindrical and a channel 120 may be semi-cylindrical.

The channels 120, and therefore the amplifier rod 110, may extend along a dimension of the amplifier assembly 100. For example, the channels, and therefore the amplifier rod 110, may extend lengthwise or widthwise along the amplifier assembly 100. The channels 120, and therefore the amplifier rod 110, may be located centrally in the amplifier assembly 100. In other words, the channels 120, and therefore the amplifier rod 110, may be located equidistantly from lateral edges of the amplifier assembly 100 defined by the heat sink plates 105 and/or located equidistantly from outward surfaces of the heat sink plates 105 (e.g., a top surface and a bottom surface of the amplifier assembly 100).

Accordingly, the amplifier assembly 100 may be symmetrical. For example, the amplifier assembly 100 may be symmetrical about any plane that bifurcates the channels 120 and/or the amplifier rod 110 into equally sized portions. As an example, the amplifier assembly 100 may be symmetrical about a plane defined by a junction of the first heat sink plate 105a and the second heat sink plate 105b. As another example, the amplifier assembly 100 may be symmetrical about a plane that bifurcates the channels 120 and/or the amplifier rod 110 and that is perpendicular to the plane defined by a junction of the first heat sink plate 105a and the second heat sink plate 105b. In this way, the heat sink plates 105 may provide even heat transfer from the amplifier rod 110. Improving evenness of heat transfer from the amplifier rod 110 may reduce stress imbalances along the amplifier rod 110, which may in turn improve performance and longevity of the amplifier rod 110.

The amplifier rod 110 may be connected (e.g., thermally connected, mechanically connected, and/or the like) to the heat sink plates 105 by solder. The solder may be a non-eutectic solder. That is, the solder may solidify and melt over a temperature range, in which the solder is a paste consistency. This is in contrast to a eutectic solder, which may solidify and melt at a particular temperature. In some implementations, the solder may be lead free, such as an alloy of tin and silver. For example, the solder may be an alloy of 95% tin and 5% silver.

During a soldering process involving the amplifier assembly 100, the non-eutectic solder maintains a position of the amplifier rod 110 relative to the channels 120, and exhibits reduced flow and/or overflow. In this way, the solder facilitates a reduction in voids between the amplifier rod 110 and the tunnel defined by the channels 120, thereby providing improved thermal connectivity between the amplifier rod 110 and the heat sink plates 105. Additionally, the non-eutectic solder being pasty (e.g., not a liquid) during soldering decreases shifting of a position of the amplifier rod, thereby potentially improving symmetry of a position of the amplifier rod 110 in the channels 120. Accordingly, the solder may surround the amplifier rod 110 in the tunnel defined by the channels 120. For example, a first threshold area of a barrel of the amplifier rod 110 may be in contact with the solder. Similarly, a second threshold area of the channels 120 may be in contact with the solder. The first threshold area or the second threshold area may be greater than 75%, 80%, 85%, 90%, 95%, 99%, and/or the like. In some implementations, a thickness of the solder that surrounds the amplifier rod 110 may be in a range (inclusive of the endpoints) from 2-200 microns, 10-100 microns, 20-50 microns, and/or the like.

In some implementations, the amplifier rod 110 may be composed of a doped glass or crystal. For example, the amplifier rod 110 may be composed of Yb:YAG. In some implementations, a barrel of the amplifier rod 110 may be coated with a metal plating to improve wetting of the amplifier rod 110 by the solder. For example, the barrel of the amplifier rod 110 may be coated with a titanium, platinum, and/or gold plating. In some implementations, end portions of the amplifier rod 110 may be coated with an AR coating. For example, end facets of the amplifier rod 110 may be coated with an AR coating. Additionally, chamfers of the end portions of the amplifier rod 110 may be coated with the AR coating. A chamfer of an end portion may be located between a barrel of the amplifier rod 110 and an end facet of the amplifier rod 110.

In some implementations, the end portions of the amplifier rod 110 (which may include end facets and/or chamfers of the amplifier rod 110) extend beyond the edge defined by the heat sink plates 105. For example, a length of the amplifier rod 110 may be greater than a length of a lateral edge (e.g., parallel to the length of the amplifier rod 110) defined by the heat sink plates 105. As another example, the length of the amplifier rod 110 may be greater than a length of the channel 120a or the channel 120b. In this way, the AR coating of the end portions of the amplifier rod 110 may be cleaned with greater ease. Moreover, extension of the end portions of the amplifier rod 110 beyond the edge defined by the heat sink plates 105 permits the inclusion of the chamfer on the end portions, thereby reducing chipping and/or delamination of the AR coating, which may otherwise occur when the end portions of the amplifier rod 110 terminate in a sharp edge.

As indicated above, FIG. 1 is provided merely as an example. Other examples may differ from what is described with regard to FIG. 1.

Figure 2:
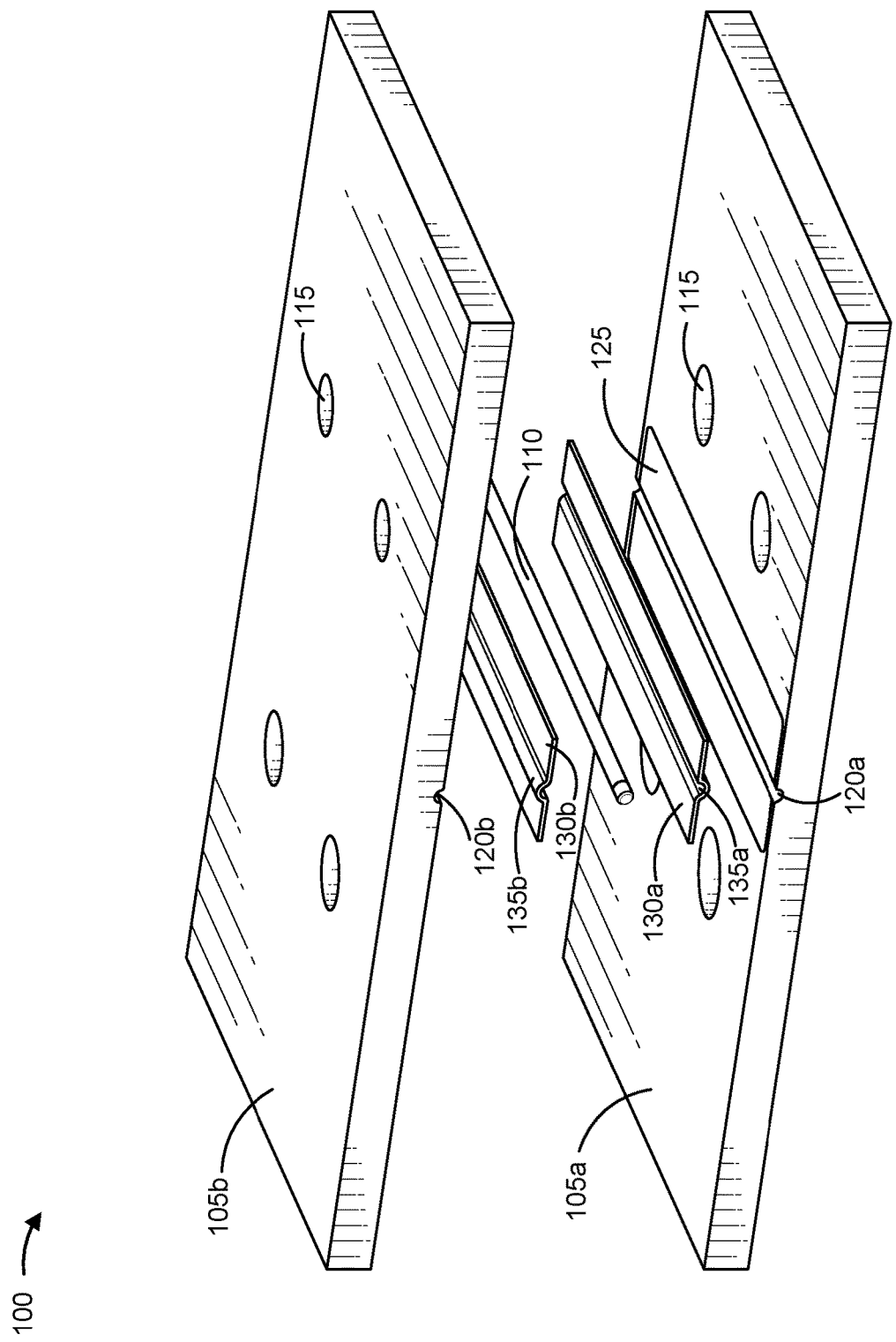
FIG. 2 is a diagram of an exploded view of the amplifier assembly of FIG. 1.

FIG. 2 is a diagram of an exploded view of the amplifier assembly 100. In particular, FIG. 2 shows the components of the amplifier assembly 100 prior to the amplifier assembly 100 undergoing a soldering process.

As shown in FIG. 2, the channel 120a may be located in a recess 125 of the first heat sink plate 105a. The recess 125 may be a depressed area of the first heat sink plate 105a relative to a surface of the first heat sink plate 105a. In some implementations, the recess 125 (including the channel 120a) may be coated with a metal plating to improve wetting of the recess 125 by the solder. For example, the recess 125 may be coated with a gold plating. The channel 120b may also be located in a recess (not shown), as described above, of the second heat sink plate 105b. The recess 125 of the first heat sink plate 105a and the recess of the second heat sink plate 105b may correspond in size and shape and may align when the amplifier assembly 100 is assembled.

In some implementations, prior to the amplifier assembly 100 undergoing a soldering process, the amplifier assembly 100 may include a first solder preform 130a and a second solder preform 130b. The solder preforms 130 may be plates that are composed of solder (e.g., a non-eutectic solder, such as an alloy of 95% tin and 5% silver). In some implementations, the first solder preform 130a may include a channel 135a formed in a planar surface of the first solder preform 130a and/or the second solder preform 130b may include a channel 135b formed in a planar surface of the second solder preform 130b. When the amplifier assembly 100 is assembled, the solder preforms 130 may align (e.g., the channels 135 may align) and define a tunnel within which the amplifier rod 110 is disposed.

In some implementations, the first solder preform 130a and the second solder preform 130b may be attached, prior to assembly of the amplifier assembly 100, such that the channels 135 align and define a tunnel. In some implementations, the amplifier assembly 100 may include a single solder preform that defines a tunnel. For example, the single solder preform may be a plate that includes two spaced channels, and the plate may be folded such that the channels align and define a tunnel. As another example, the single solder preform may be cast to include a tunnel, and may also include planar surfaces on opposite sides of the tunnel. Descriptions herein relating to solder preforms 130 are equally applicable to a single solder preform.

A solder preform 130 may have a shape that corresponds to a channel 120 of a heat sink plate 105. For example, a shape of a channel 135 of the solder preform 130 (e.g., a convex surface of the channel 135 of the solder preform 130) may correspond to a shape of the channel 120 (e.g., a concave surface of the channel 120), such that the channel 135 may be received (e.g., nested) in the channel 120. In addition, a shape of the planar surface of the solder preform 130 may correspond to the recess 125. In other words, a shape of the solder preform 130 may correspond to a combined shape of the recess 125 and the channel 120. Moreover, a combined volume of the solder preforms 130 and the amplifier rod 110 may correspond (e.g., have a difference of ±2%, ±1%, and/or the like) to a combined volume of the recess 125 and the channel 120a of the first heat sink plate 105a and the recess and the channel 120b of the second heat sink plate 105b. In this way, during a soldering process, a solder preform 130 will fill a remaining volume of the recess 125 and the channel 120 that is not filled by the amplifier rod 110.

In some implementations, a shape of the amplifier rod 110 may conform to a shape of a channel 135 of a solder preform 130. For example, the amplifier rod 110 may have a circular cross section that conforms to a semi-circular cross section of a channel 135. In other words, the amplifier rod 110 may be cylindrical and a channel 135 may be semi-cylindrical.

As indicated above, FIG. 2 is provided merely as an example. Other examples may differ from what is described with regard to FIG. 2.

Figure 3:
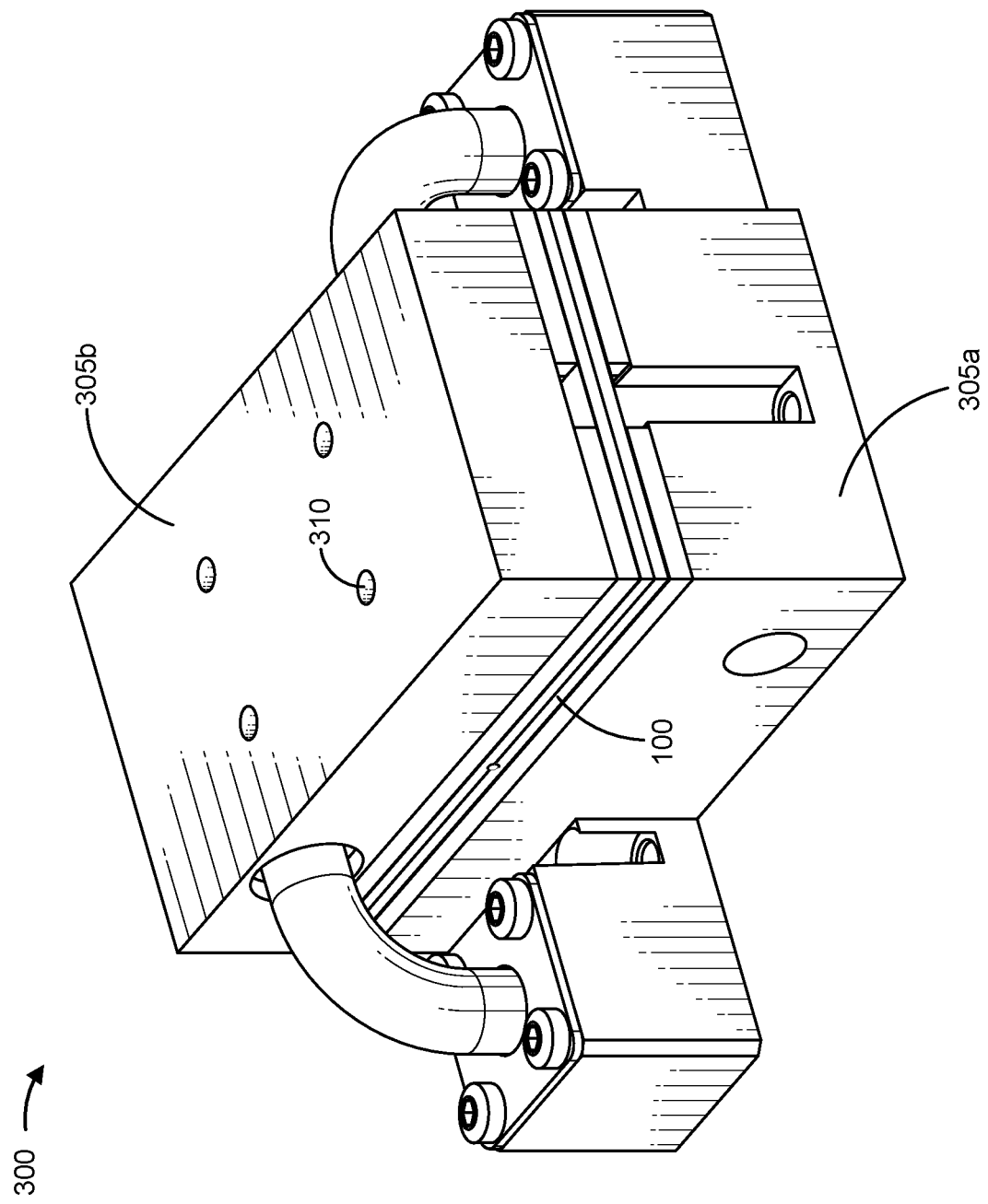
FIG. 3 is a diagram of the amplifier assembly of FIG. 1 in use with a heat exchange system.

FIG. 3 is a diagram of the amplifier assembly 100 in use with a heat exchange system 300. The heat exchange system 300 may include a first cooling block 305a and a second cooling block 305b. The amplifier assembly 100 may be disposed between the cooling blocks 305. In other words, the cooling blocks 305 may sandwich the amplifier assembly 100. The cooling blocks 305 may include apertures 310. For example, the first cooling block 305a may include a first set of apertures 310 that align with a second set of apertures 310 of the second cooling block 305b. Moreover, the amplifier assembly 100 may be disposed between the cooling blocks 305 such that the apertures 310 of the cooling blocks 305 align with the apertures 115 of the amplifier assembly 100. In this way, bolts, or other fasteners, may be received in the apertures 310 and the apertures 115, to thereby adjoin the amplifier assembly 100 and cooling blocks 305.

The cooling blocks 305 may provide active heat exchange from the amplifier assembly 100 (e.g., from the heat sink plates 105) to a fluid medium (e.g., air or water) that is circulated through the cooling blocks 305. In some implementations, the heat exchange system 300 and/or the amplifier assembly 100 may be associated with a free space laser system.

As indicated above, FIG. 3 is provided merely as an example. Other examples may differ from what is described with regard to FIG. 3.

Figure 4:
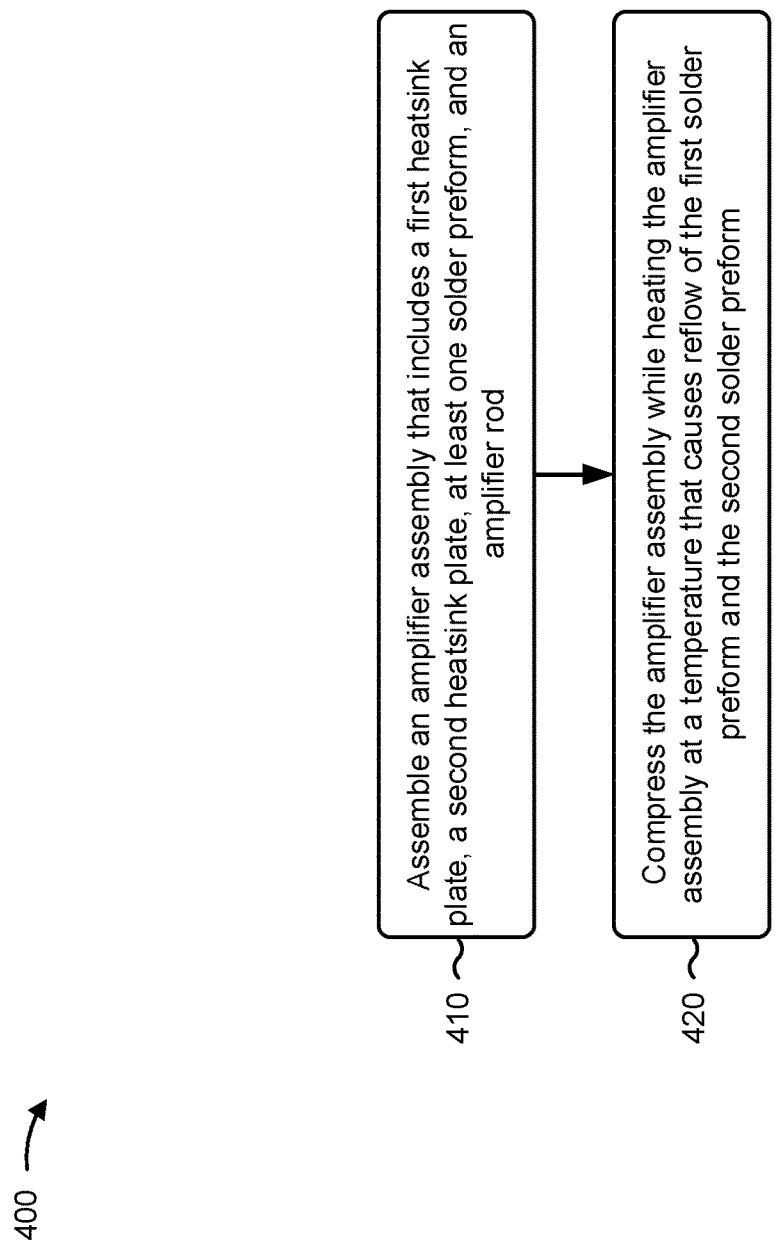
FIG. 4 is a flowchart of an example process for manufacturing an amplifier assembly described herein.

FIG. 4 is a flowchart of an example process 400 for manufacturing an amplifier assembly described herein. In some implementations, one or more process blocks of FIG. 4 may be performed by a machine.

As shown in FIG. 4, process 400 may include assembling an amplifier assembly that includes a first heat sink plate (e.g., first heat sink plate 105a), a second heat sink plate (e.g., second heat sink plate 105b), at least one solder preform (e.g., a first solder preform, such as first solder preform 130a, and a second solder preform, such as second solder preform 130b), and an amplifier rod (e.g., amplifier rod 110) (block 410). The amplifier assembly may be assembled such that the solder preforms sandwich the amplifier rod. For example, the solder preforms may be positioned so as to align and define a tunnel in which the amplifier rod is disposed, as described above. Alternatively, as described above, a single solder preform may define a tunnel in which the amplifier rod is disposed.

The amplifier rod, when assembled to the amplifier assembly, may be polished. That is, end portions of the amplifier rod may have been polished prior to when the amplifier rod is assembled to the amplifier assembly. Accordingly, in some implementations, process 400 may further include polishing end portions of the amplifier rod prior to assembly of the amplifier rod to the amplifier assembly. Additionally, the amplifier rod, when assembled to the amplifier assembly, may include an AR coating. That is, end portions of the amplifier rod may have been coated with an AR coating prior to when the amplifier rod is assembled to the amplifier assembly. Accordingly, in some implementations, process 400 may further include coating end portions of the amplifier rod with an AR coating prior to assembly of the amplifier rod to the amplifier assembly. In some implementations, process 400 may not include polishing and/or coating end portions of the amplifier rod after a soldering process. In this way, manufacture of the amplifier assembly may be simplified.

In addition, the amplifier assembly may be assembled such that respective channels (e.g., channels 135) of the solder preforms (or a single solder preform) are received in respective channels (e.g., channels 120) of the heat sink plates, and respective planar surfaces of the solder preforms are received in respective recesses (e.g., recess 125) of the heat sink plates, as described above. Furthermore, the amplifier assembly may be assembled such that the heat sink plates sandwich the solder preforms (which sandwich the amplifier rod). In some implementations, the heat sink plates may be positioned on a manufacturing jig. The manufacturing jig may include pins that extend through apertures (e.g., apertures 115) of the heat sink plates, to thereby maintain an alignment of the heat sink plates during manufacture. In such a case, the first heat sink plate may be positioned on the manufacturing jig, the first solder preform may be positioned on the first heat sink plate, the amplifier rod may be positioned on the first solder preform, the second solder preform may be positioned on the amplifier rod, and the second heat sink plate may be positioned on the manufacturing jig, to thereby assemble the amplifier assembly.

As further shown in FIG. 4, process 400 may include compressing the amplifier assembly while heating the amplifier assembly at a temperature that causes reflow of the first solder preform and the second solder preform (block 420). The amplifier assembly may be compressed by subjecting the amplifier assembly to a particular force that is sufficient to achieve a threshold level of contact between the first heat sink plate and the second heat sink plate and between the first solder preform and the second solder preform (e.g., between a planar surface of the first solder preform and a planar surface of the second solder preform). In some implementations, the compression may be applied by loaded springs (e.g., pressure screws), abutting one of the heat sink plates, and associated with the pins of the manufacturing jig.

The amplifier assembly may be heated, under compression, using an oven (e.g., a reflow oven), an infrared lamp, and/or the like, as part of a soldering process (e.g., a reflow soldering process). In some implementations, the temperature that causes reflow of the solder preforms causes reflow of the solder preforms to a paste consistency (i.e., a transitional consistency between a solid consistency and a liquid consistency), but does not cause reflow of the solder preforms to a liquid consistency. In other words, the temperature that causes reflow is within a threshold temperature range in which the solder preforms are a paste consistency. Thus, at temperatures below the threshold temperature range, the solder preforms would be a solid consistency, and at temperature above the threshold temperature range, the solder preforms would be a liquid consistency.

The solder preforms, in the paste consistency achieved during heating, may flow within the respective channels and/or the respective recesses of the heat sink plates, to thereby cover threshold areas of the amplifier rod and the channels. As a result of the paste consistency, the solder may not overflow the channels and/or recesses (as would occur with a liquid consistency), and thereby provide improved surface coverage of the amplifier rod and the channels of the heat sink plates, as described above. In this way, improved thermal connectivity between the amplifier rod and the heat sink plates may be achieved.

Moreover, the solder preforms, in the paste consistency achieved during heating, may fuse together. In this way, the solder may surround the amplifier rod, thereby further improving thermal connectivity between the amplifier rod and the heat sink plates. In addition, the fused solder preforms may provide a mechanical connection (as well as a thermal connection) between the first heat sink plate and the second heat sink plate, such that additional fasteners, adhesives, and/or the like, to secure the first heat sink plate and the second heat sink plate may be eliminated. Furthermore, the solder preforms, in the paste consistency achieved during heating, may resist displacement of the amplifier rod from a symmetrical position within the amplifier assembly in a manner that cannot be achieved with a solder that becomes a liquid during heating. In some implementations, each of the heat sink plates may include one or more additional recesses (which may be coated with a metal plating, such as a gold plating). The one or more additional recesses may receive one or more additional solder preforms (e.g., planar solder preforms) during assembly of the amplifier assembly, which may fuse during compression and heating of the amplifier assembly to provide further mechanical connection between the first heat sink plate and the second heat sink plate.

In some implementations, process 400 may further include curing the amplifier assembly after heating of the amplifier assembly. For example, the amplifier assembly may be cured at a temperature that is less than the temperature that caused reflow of the solder preforms. The amplifier assembly may be cured with or without compression of the amplifier assembly. In some implementations, process 400 may further include cutting the amplifier assembly to a particular size after heating of the amplifier assembly.

In some implementations, process 400 may further include installing, after compressing and heating the amplifier assembly (e.g., after curing the amplifier assembly), the amplifier assembly between a first cooling block (e.g., cooling block 305a) and a second cooling block (e.g., cooling block 305b), as described above. In some cases, end portions of the amplifier rod may extend beyond the edge defined by the heat sink plates after installing the amplifier assembly between the cooling blocks. In some cases, end portions of the amplifier rod may include a chamfer after installing the amplifier assembly between the cooling blocks. That is, the amplifier assembly may be installed between the cooling blocks without process 400 including grinding of the end portions of the amplifier rod after the soldering process. For example, by reducing or eliminating overflow solder that is deposited on the end portions, grinding of the end portions after the soldering process may be eliminated. In this way, manufacture of the amplifier assembly may be simplified.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An amplifier assembly, comprising:
a first heat sink plate that includes a first channel;
a second heat sink plate that includes a second channel,
wherein the second heat sink plate is soldered with the first heat sink plate by a non-eutectic solder, such that the first channel and the second channel align; and
an amplifier rod disposed in the first channel and the second channel,
wherein the amplifier rod is connected to the first heat sink plate and the second heat sink plate by the non-eutectic solder, and
wherein a shape of the non-eutectic solder conforms to a shape of a first recess of the first heat sink plate and a second recess of the second heat sink plate.

2. The amplifier assembly of claim 1, wherein a first end portion and a second end portion of the amplifier rod extend beyond an edge defined by the first heat sink plate and the second heat sink plate.

3. The amplifier assembly of claim 1, wherein a first end portion and a second end portion of the amplifier rod include an anti-reflection coating.

4. The amplifier assembly of claim 1, wherein a first end portion and a second end portion of the amplifier rod include a chamfer.

5. The amplifier assembly of claim 1, wherein greater than 95% of an area of a barrel of the amplifier rod is in contact with the non-eutectic solder.

6. The amplifier assembly of claim 1, wherein the amplifier assembly is symmetrical about a plane perpendicular to a junction of the first heat sink plate and the second heat sink plate.

7. The amplifier assembly of claim 1, wherein a shape of the amplifier rod conforms to a shape of the first channel or a shape of the second channel.

8. The amplifier assembly of claim 1, wherein the first channel is located within the first recess and the second channel is located within the second recess.

9. The amplifier assembly of claim 1, wherein a first end portion and a second end portion of the amplifier rod are polished.

10. The amplifier assembly of claim 1, wherein the non-eutectic solder remains within the first recess, the first channel, the second recess, and the second channel, without overflowing to other portions of the first heat sink plate or the second heat sink plate.

11. A heat exchange system, comprising:
a first cooling block;
a second cooling block; and
an amplifier assembly disposed between the first cooling block and the second cooling block, the amplifier assembly comprising:
a first heat sink plate that includes a first channel;
a second heat sink plate that includes a second channel,
wherein the second heat sink plate is soldered with the first heat sink plate by a non-eutectic solder, such that the first channel and the second channel align; and
an amplifier rod disposed in the first channel and the second channel,
wherein the amplifier rod is connected to the first heat sink plate and the second heat sink plate by the non-eutectic solder, and
wherein a shape of the non-eutectic solder conforms to a shape of a first recess of the first heat sink plate and a second recess of the second heat sink plate.

12. The heat exchange system of claim 11, wherein a first end portion and a second end portion of the amplifier rod extend beyond an edge defined by the first heat sink plate and the second heat sink plate.

13. The heat exchange system of claim 11, wherein a first end portion and a second end portion of the amplifier rod include an anti-reflection coating and a chamfer.

14. The heat exchange system of claim 11, wherein greater than 80% of an area of a barrel of the amplifier rod is in contact with the non-eutectic solder.

15. The heat exchange system of claim 11, wherein the amplifier assembly is symmetrical about a plane defined by a junction of the first heat sink plate and the second heat sink plate.

16. The heat exchange system of claim 11, wherein greater than 95% of an area of a barrel of the amplifier rod is in contact with the non-eutectic solder.

17. The heat exchange system of claim 11, wherein a shape of the amplifier rod conforms to a shape of the first channel or a shape of the second channel.

18. The heat exchange system of claim 11, wherein the first channel is located within the first recess and the second channel is located within the second recess.

19. The heat exchange system of claim 11, wherein a first end portion and a second end portion of the amplifier rod are polished.

20. The heat exchange system of claim 11, wherein the non-eutectic solder remains within the first recess, the first channel, the second recess, and the second channel, without overflowing to other portions of the first heat sink plate or the second heat sink plate.

\* \* \* \* \*